United States Patent [19]

Konsella

[11] Patent Number: 5,651,099
[45] Date of Patent: Jul. 22, 1997

[54] USE OF A GENETIC ALGORITHM TO OPTIMIZE MEMORY SPACE

[75] Inventor: Shane Konsella, Boise, Id.

[73] Assignee: Hewlett-Packard Company, Palo Alto, Calif.

[21] Appl. No.: 378,329

[22] Filed: Jan. 26, 1995

[51] Int. Cl.⁶ ................................................ G06F 15/18
[52] U.S. Cl. ................................................ 395/13; 395/601
[58] Field of Search ................................ 395/13; 341/51, 341/79

[56] References Cited

U.S. PATENT DOCUMENTS

| | | | |
|---|---|---|---|
| 4,697,242 | 9/1987 | Holland et al. | 364/513 |
| 4,881,178 | 11/1989 | Holland et al. | 364/513 |
| 4,935,877 | 6/1990 | Koza | 364/513 |
| 5,058,144 | 10/1991 | Fiala et al. | 375/122 |
| 5,136,686 | 8/1992 | Koza | 395/13 |
| 5,148,513 | 9/1992 | Koza et al. | 395/13 |
| 5,151,697 | 9/1992 | Bunton | 341/51 |
| 5,151,950 | 9/1992 | Hullender | 382/13 |
| 5,226,082 | 7/1993 | Kustka | 380/46 |
| 5,276,868 | 1/1994 | Poole | 395/600 |
| 5,343,554 | 8/1994 | Koza et al. | 395/13 |
| 5,379,036 | 1/1995 | Storer | 341/51 |
| 5,406,279 | 4/1995 | Anderson et al. | 341/51 |
| 5,412,384 | 5/1995 | Chang et al. | 341/79 |
| 5,528,701 | 6/1996 | Aref | 382/178 |

FOREIGN PATENT DOCUMENTS

| | | | |
|---|---|---|---|
| 4110400 | 10/1992 | Germany | G06F 15/66 |
| 7-44520 | 2/1995 | Japan | G06F 15/18 |
| 7-85270 | 3/1995 | Japan | G06T 5/00 |

OTHER PUBLICATIONS

Chintrakulchai, Pichet "High performance fractal image compression," Doctoral Thesis in computer science, Dartmouth college, UMI Dissertation Services Aug. 1995.

Seke, Erol "A study of distortion measures for vector quantization of images," Doctoral Thesis in electrical engineering, Lehigh university, UMI Dissertation Services Oct. 1995.

Yu et al., "Range Image segmentation and fitting by residual consensus," IEEE pp. 657–660 Mar. 1992.

Lam, Sly et al, "A Parallel genetic search Algorithm for motion estimation," Proceedings of the SPIE, vol. 2617 pp. 12–22 Apr. 1994.

(List continued on next page.)

*Primary Examiner*—Robert Downs
*Assistant Examiner*—Jeffrey Smith
*Attorney, Agent, or Firm*—Anthony J Baca

[57] ABSTRACT

The present invention is accomplished by first initializing a plurality of individuals. A trie is constructed for each individual, where the trie represents the original data. The trie comprises a root node, a plurality of sub-nodes and sub-arrays in a hierarchical arrangement. The individual indicates the number of the sub-nodes, sub-arrays and number of entries in each sub-array. Within a trie, delete any sub-array which contains redundant data and remove any of sub-node which contains redundant data. Apply an overlapping reduction function to the trie. With the trie constructed, determine the size for the trie and associate the size to the individual. Select a mating population based on trie size. Choose and perform at least one operation for the mating population, where the operation is the operations of crossover or mutation. For crossover, create at least one new individual by recombining the "genes" of at least two individual from the mating population. Then, add the new individual to the plurality of individuals. For mutation, mutate an individual by stochastically changing a property of the individual, then place the mutated individual in the plurality of individuals. Iterate for a predefined number of generations. Finally, keep in memory the trie with the smallest size.

20 Claims, 10 Drawing Sheets

OTHER PUBLICATIONS

Chee–Hung, "Data compression by multiresolution tree search," Optical engineering vol. 33 No. 7 pp. 2136–2142 Jul. 1994.

Delport, "VQ codebook design using genetic algorithm," Electronics Letters, vol. 32 No. 3 pp. 193–194 Feb. 1996.

Rebaudengo, "Floorplan area optimization using genetic algorithms," IEEE 1994 4th Great Lakes Symposium on VLSI Apr. 1994.

Park, "A course grain parallel genetic algorithm for data mapping" Proceeding, Parallel and distributed computing and systems Dec. 1994.

Amaral, "Designing genetic algorithms for the state assignment problem," IEEE transactions on systems, man, and cybernetics, vol. 25 No. 4 Apr. 1995.

Mansour, "Allocating data to distributed memory multiprocessors by genetic algorithms," Concurrency: Practice and experience, vol. 6 No. 6 pp. 485–504, J. Wiley & Sons, Chichester, Sussex Sep. 1994.

Xue, "Fuzzy Associative memory optimization using genetic algorithms," IEEE Fuzzy Systems, Int'l conference 1994 Jun. 1994.

Slyz, Marko John, "Image Compression Using A Ziv–Lempel Type Coder," UMI Dissertation Services, Ann Arbor, 1991 May 1991.

Chu, "Genetic Algorithm Search of Multiresolution Tree With Applications in Data Compression," Proceedings of SPIE, The International Society for Optical Engineering, vol. 2242, pp. 950–962. Apr. 1994.

Chow et al., "Genetic Motion Search Algorithm for Video Compression," IEEE Transactions on Circuits and Systems for Video Technology, vol. 3, No. 6 Dec. 1993.

Park, "A Course Grain Parallel Genetic Algorithm for Data Mapping," Proceedings of the 6th IASTED/ISMM International Conference, pp. 203–206. Oct. 1994.

"Compressing Sparse Tables Using A Genetic Algorithm", Karel Driesen; pp. 1–11.

```
0 1│1│0│1 0 1    <-SEARCH KEY
  0 1 1 1 0 0    <-TRIE ENCODING
```

| FILE | UNCOMPRESSED FILE SIZE | UNIX COMPRESSED FILE SIZE | GA COMPRESSED FILE SIZE | GA COMPRESSED RATIO |
|---|---|---|---|---|
| MONOCHROME ICON | 15550 | 1651 | 2892 | 0.19 |
| CARTOON | 15670 | 3970 | 8254 | 0.53 |
| PHOTO | 16198 | 2929 | 6689 | 0.41 |
| IMAGE | 15670 | 4289 | 8886 | 0.57 |
| SCANNED TEXT | 15550 | 5917 | 9003 | 0.58 |
| SOUNDFILE | 12580 | 11970 | 12854 | 1.02 |

USE OF A GENETIC ALGORITHM TO OPTIMIZE MEMORY SPACE

TECHNICAL FIELD

The present invention generally relates to genetic algorithms and more particular to the use of a genetic algorithm to optimize computer memory space containing sparse and redundant data while maintaining high speed access to the optimized data structure.

BACKGROUND OF THE INVENTION

The natural selection process provides a powerful tool for problem solving. This is shown by nature and its various examples of biological entities that survive and evolve in various environments. In nature, complex combinations of traits give particular biological population the ability to adapt, survive, and reproduce in their environments. Equally impressive is the complex, relatively rapid and robust adaptation and relatively good interim performance that occurs amongst the population of individuals in nature in response to changes in the environment. Nature's methods for adapting biological populations to their environment and nature's method for adapting these populations to successive changes in their environments (including survival and reproduction of the fittest) provides a useful model. This model can be used to develop methods to solve a wide variety of complex problems that are generally thought to require "intelligence" to solve.

In nature, a gene is the basic functional unit by which hereditary information is passed from parents to offspring. Genes appear at particular places (called gene loci) along the molecules of DNA (deoxyribonucleic acid). DNA is a long threadlike biological molecule that has the ability to carry hereditary information and the ability to serve as a model for the production of replicas of itself. All known life forms on this planet including bacteria, fungi, plants, animals, and humans are based on the DNA molecule.

Genetic coding of the DNA molecule consists of long strings (sequences) of four possible gene values that can appear at the various gene loci along the DNA molecule. For DNA, the four possible gene values refer to four bases named adenine, guanine, cytosine, and thymine (usually abbreviated as A, G, C, and T respectively). Thus, the genetic code in DNA consists of long strings such as CTCGACGGTCTC.

A chromosome consists of numerous gene loci with a specific value (called an "allele") at each gene locus. The chromosome set for a human being consists of 23 pairs of chromosomes. The chromosomes together provide the information and instructions necessary to construct and describe one individual human being and contains about 3,000,000,000 genes. These 3 billion genes constitute the so called "genome" for one particular human being. Complete genome of the approximate five billion living human beings together constitute the entire pool of genetic information for the human species. It is known that certain gene values occurring at certain places in certain chromosomes, control certain traits of the individual, including traits such as eye color, susceptibility to a particular disease, etc.

Organisms created from the DNA information spend their lives attempting to deal with their environment. Some organisms do better than others in grappling with or opposing their environment. In particular, some organisms survive to the age of reproduction and therefore pass on their genetic makeup to their offspring. In nature, the process of Darwinian natural selection causes organisms with traits that facilitate survival to the age of reproduction to pass on all or part of their genetic make-up to offspring. Over a period of time and many generations the population as a whole evolves so that the chromosome strings in the individuals in the surviving population perpetuate traits that contribute to survival of the organism in its environment.

A genetic algorithm is a model of machine learning which derives its behavior from a metaphor of the process of evolution previously described. This is done by the creation, within a machine, of a population of individuals represented by chromosomes, in essence a set of character strings that are analogous to the base four chromosomes of the DNA molecule. The individuals in the population then go through a process known as evolution.

It should be noted that evolution (in nature or anywhere else) is not a purpose or directed process. That is, there is no evidence to support the assertion that the goal of evolution is to produce mankind. Indeed, the process of nature seems to boil down to different individuals competing for resources in the environment. Some are better than others; those that are better are more likely to survive and propagate their genetic material.

In nature, the encoding of genetic information (genome) is done in a way that admits asexual reproduction (such as budding) which results in offspring that are genetically identical to the parent. Sexual reproduction allows the creation of genetically different offspring that are still of the same species. Genetic information may also be re-arranged by a process known as recombination. In its most simplified form, recombination can be described as two chromosomes exchanging pieces of genetic information with each other. A recombination operation may also be referred to as cross-over because of the way that genetic material crosses over from one chromosome to another.

The selection of who gets to mate is a function of the fitness of the individual at competing for resources in its environment. Some genetic algorithms use a simple function of the fitness measure (probablistically) to select individuals for further operations such as crossover. Other implementations use a model in which certain randomly selected individuals in a sub-group compete and the fittest is selected. This is called tournament selection and is the form of selection used in nature. The two processes that most contribute to evolution are crossover and fitness based selection.

Mutation also plays a role in this process, though it is not the dominate role. Mutation occurs when genetic material is randomly altered.

Genetic algorithms are used for a number of different application areas. An example of this includes multi-dimensional mulit-modal optimization problems in which the character string of the chromosome can be used to encode the values of the different parameters being optimized. Such is the case in the present invention.

In practice the genetic model of computation is implemented by having arrays of bits or characters to represent the chromosomes. Simple bit manipulation operations allow the implementation of crossover, mutation, and other operations. Although a substantial amount of research has been performed on variable length strings and other structures, the majority of work with genetic algorithms is focused on fixed length character strings.

When the genetic algorithm is implemented it is usually done in a manner that involves the following cycle: evaluate the fitness of all the individuals in the population; create a new population by performing operations such as fitness proportionate selection, crossover and mutation on individuals whose fitness has just been measured; discard the old population; and iterate using the new population.

One iteration of this loop is referred to as a generation. There is no theoretical reason for this as an implementation model. Indeed, we do not see this punctuated behavior in populations in nature as a whole, but it is a convenient implementation model.

The first generation of this process operates on a population of randomly generated individuals. From there on the genetic operation, in concert with the fitness measure, operates to improve the population.

Genetic algorithms are highly parallel algorithms that transform populations of individual mathematical objects (typically fixed length binary character strings) into new populations using operations patterned after 1) natural genetic operation such as sexual recombination or crossover and 2) fitness proportion selection (Darwinian survival of the fittest). Genetic algorithms begin with an initial population of individuals as stated above and then iteratively evaluate the individuals in the population for fitness with respect to the problem environment and perform genetic operations on various individuals in the population to produce a new population. John Holland of the University of Michigan presented the pioneering formulation of genetic algorithms or fixed length binary character strings in *Adaptation in Artificial and Natural Systems*, by Professor John H. Holland, 1975. Holland established, among other things, that the genetic algorithm is a mathematically near optimal approach to adaptation in that it maximizes expected overall payoff when the adaptive process is viewed as a multi-armed slot machine program requiring an optimal allocation of future trials giving currently available information. Recent work in genetic algorithms and genetic classifier systems can be found in *Preceding of an International Conference on Genetic Algorithms and Their Applications*, John J. Grefenstette (1985), *Genetic Algorithms and Their Applications: Proceedings of the Second International Conference on Genetic Algorithms*, John J. Grefenstette (1987), *Genetic Algorithms In Search, Optimization, and Machine Learning*, David E. Goldberg (1989), *Genetic Algorithms and Simulated Annealing*, Lawrence Davis (1987) and *Proceedings of the Third International Conference of Genetic Algorithms*, J. D. Schaffer (1989).

In *Adaptation in Artificial and Natural Systems*, Holland summarizes his research in genetic algorithms and presents an overall mathematical theory of adaptation for both natural and artificial systems. A key part of this book describes a genetic algorithm patterned after nature's method of biological adaptation. Additional information can be found in U.S. Pat. No. 4,697,242 to Holland and U.S. Pat. No. 4,881,178 to Holland both incorporated herein by reference.

Empirical studies by various researchers have demonstrated the capabilities of such genetic algorithms in many diverse areas, including function optimization, operation of gas pipeline and several other reviewed in Goldberg.

In the chapter entitled "An Overview" contained in the 1987 collection *Genetic Algorithms and Simulated Annealing*, Lawrence Davis and Martha Steenstrup stated, "In all of Holland's work, and in the work of many of his students, chromosomes are bit streams, lists of 0's and 1's." In addition they continue, "Some researchers have explored the use of other representations often in connection with industrial algorithms. Examples of other representations included ordered list (for bin packing), embedded lists (for factory scheduling problems), variable element lists (for semiconductor layout), and the representations used by Glover and Grefenstette in this volume."

Some researchers have attempted to solve search and optimization problems using schemes patterned after evolution that employ mutation-plus-save-the-best strategies. The few results obtained from these efforts are highly specific to particular application domains and largely reflect the cleverness of implementation rather than the usefulness of a general technique for achieving adaptation increases in fitness in the population. It is important to note that mutation is not the primary means by which biological populations in nature improve their fitness and it is not the primary means used in the present invention.

Since Holland's 1975 book, Holland and various colleagues have developed an application of conventional genetic algorithms called the genetic classifier system. The classifier system is a group of rules. Each rule consists of a conditioned part and an action part (i.e., and IF THEN rule). Both the conditioned part and the action part of each rule are like the individuals in the conventional algorithm in that they are strings of 0's and 1's of fixed length. In a classifier system, messages are received from the environment and invoke those rules whose conditional part match the message coming in. This indication triggers the action part of the rule. The action part of the rule sends out a new message.

Classifier systems are described in the 1978 article *Cognitive Systems Based On Adaptive Algorithms*. (John Holland and Judith S. Reitman) In classifier systems, credit is assigned to chains of individuals that are invoked using credit allocation scheme known as the "bucket brigade". The Holland process is a combination of a classifier system and a "bucket brigade" algorithm.

In U.S. Pat. No. 5,343,554, to John R. Koza genetic algorithms, as previously described are expanded into what is now known as genetic programming. One of the primary objectives of genetic programming is to remove the limitation of using fixed length binary strings to represent the population. Because genetic programming is not within the scope of the present invention a brief description will suffice here.

In one embodiment of Koza the apparatus and process initially creates a population of entities which are evolved to automatically encode a set of data values into a procedure or function capable of approximating those data values. Thus, by using this embodiment, data, such as video, audio, or images, can be transformed into a function whose representation is cheaper to store and transmit than is the data itself.

The function generated using Koza's invention is an approximation of the original data. For the data types enumerated above, this approximation maybe sufficient. However, for more exact data such as computer programs, computer data bases, and the like, an approximation to the original data will not suffice. It should be noted, that in some circumstances Koza's embodiment may actually reproduce the original data, however, this is not guaranteed. Simply put, Koza's approach does not exhibit the property of reciprocity and therefore is a "noisy" approach, as used in information theory.

A global computer system requires multilingual applications and platforms with a minimum of code complexity and memory requirements. However, multilingual requirements almost always equate to additional code complexity. As code complexity increases, development and maintenance cost follow. This nearly exponential cost increase may make some international projects unfeasible. Adding to the costs, complex applications generally have higher memory consumption. Thus, running certain applications becomes impossible on cheaper platforms.

One aspect of code complexity problem has been addressed by the Unicode Consortium with the development of a 2-byte character encoding standard that includes characters from all of the world's scripts as well as technical symbols in common use. These characters include scripts from countries such as Japan, China, Korea, Russia, Saudi Arabia, France, etc. Because it employs a fixed-width encoding, any Unicode Compliant application can be easily localized for different countries.

However, the problem of large memory requirements remains, especially when you consider that the Unicode standard has code space for 65,536 characters. To ensure backward compatibility, mappings between Unicode and the world's other standards must be provided. It is these mappings which result in the most overbearing memory requirements.

One such mapping relates to Shift-Jis, the most common character set standard in use in Japan. Because of Shift-Jis's popularity, it is imperative that Unicode Compliant platforms provide a Shift-Jis to Unicode mapping for backward compatibility. However, since Shift-Jis defines 7,037 characters (6,942 of which are 2-byte) spread over the range 32 to 60,068 and Unicode currently defines over 28,000 characters (all of which are 2-byte) over the range 0 to 65,534, such a mapping could require a considerable amount of memory. The problem, then is to minimize the memory required for a Shift-Jis to Unicode mapping without sacrificing access time.

One method for providing a Shift-Jis to Unicode mapping is to use a simple array, where the index into the array is the Shift-Jis code for a particular character and the value at that position is the Unicode code for that character. This method would require:

60,038 codes*2 bytes=120,072 bytes

This is obviously not an optimal solution, but it clarifies the problem. To further explore the problem, consider a simple lookup table, where the first column of the table contains the Shift-Jis code for a particular character, and the second column contains the Unicode code for the character. This method would require:

7,037 characters*2 bytes*2 columns=28,148 bytes

In addition, this method requires a search operation to find the required data. Using a binary search method, the worst case lookup would require $\log_2(7,037) \cong 12$ comparisons.

A common method of reducing the size of a block of data is binary compression. Several algorithms exist but, each suffers from three significant problems:

1) When a chunk of data is decompressed, it must be stored somewhere. Therefore, some memory must be set aside for receiving uncompressed blocks;
2) The algorithms can be difficult to program and the code space required may offset the savings from compressing the data; and
3) Since data must be decompressed, access times are long.

Even without these problems, binary compression rarely achieves more than 50% compression. Assuming one started with the lookup table approach, one would still need over 14 kb of space to hold the compressed data.

SUMMARY OF THE INVENTION

The present invention describes a method for storing original data in a minimum amount of computer memory. The present invention is accomplished by first initializing a plurality of individuals. A trie is constructed for each individual, where the trie represents the original data. The trie comprises a root node, a plurality of sub-nodes and sub-arrays in a hierarchical arrangement. The individual indicates the number of the sub-nodes, sub-arrays and number of entries in each sub-array. Within a trie, delete any sub-array which contains redundant data and remove any of sub-node that contains redundant data. Apply an overlapping reduction function to the trie. With the trie constructed, determine the size for the trie and associate the size to the individual.

Next, select a mating population based on trie size. Individuals with relatively small trie sizes receive multiple copies in the mating population while those individual with relatively large trie sizes are not selected. Choose and perform an operation for the mating population, where the operation is at least one of the operations of crossover or mutation. If the chosen operation is crossover, create at least one new individual by crossover using at least two individuals from the mating population. Then, add the new individual to the plurality of individuals. If the chosen operation is mutation, mutate an individual by stochastically changing a property of the individual, then place the mutated individual in the plurality of individuals. Iterate for a predefined number of generations. Finally, keep in memory the trie with the smallest size.

BRIEF DESCRIPTION OF THE DRAWINGS

A better understanding of the invention may be had from the consideration of the following detailed description taken in conjunction with the accompanying drawings in which.

DETAILED DESCRIPTION OF THE PREFERRED EMBODIMENTS

The present invention is not limited to a specific embodiment illustrated herein. The preferred embodiment of the present invention uses a Genetic Algorithm approach to minimizing the size of one mapping, Shift-Jis (Japan's most common character set) to Unicode. This method uses a trie structure, which provides faster and more memory efficient access than other compression schemes, and exploits the regular nature of gaps in the Shift-Jis standard through the use of simple trie minimizing operators, namely:
empty sub-array deletion
interior sub-node deletion
overlapping In a radix search trie, the bits of the search keys are used to traverse the trie, rather than their values, so one full key comparison completes the search. In other words, the worst case search requires O(k) comparisons, where k equals the number of bits in the longest search key.

Figure 1:
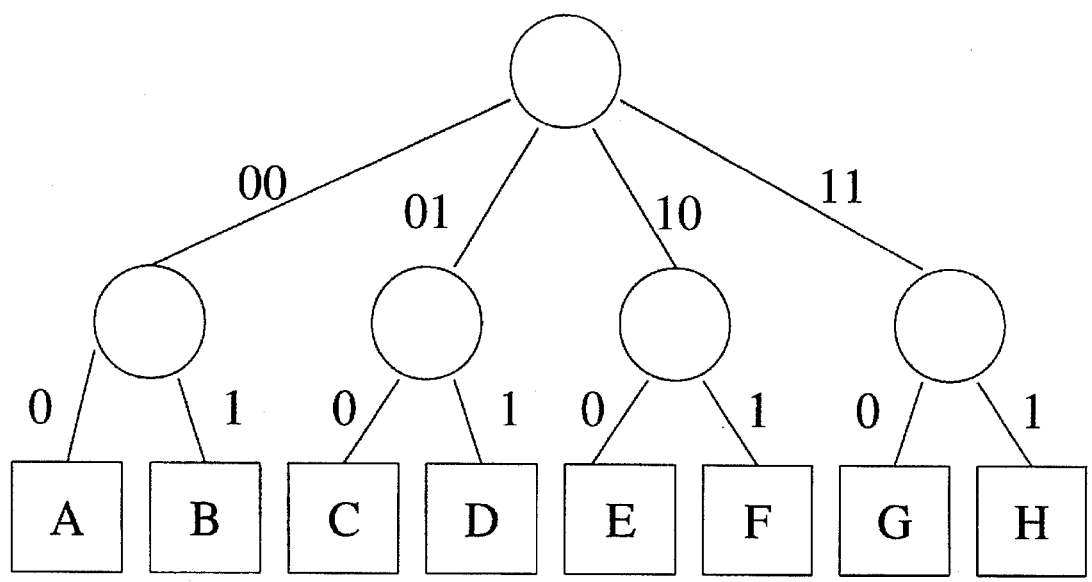
FIG. 1 presents a graphical representation of a hybrid multiway radix search trie.

A hybrid multiway radix search trie for the search space {A, B, C, D, E, F, G, H} is shown in FIG. 1. The fact that more than one bit may be used when determining the link to traverse makes it multiway. Because the node types, classified by the number of pointers in a sub-node, may differ from level to level it is hybrid. Note that data elements are never more than n layers deep, where n is the length of a search key in bits.

In the trie in FIG. 1, all keys are 3 bits long. Searching with the key 010 would yield C. The first 2 bits of the key, 01, determine which link to traverse from the root to the second level; The last bit, 0, determines which link to traverse from the second level to the third.

Figure 2:
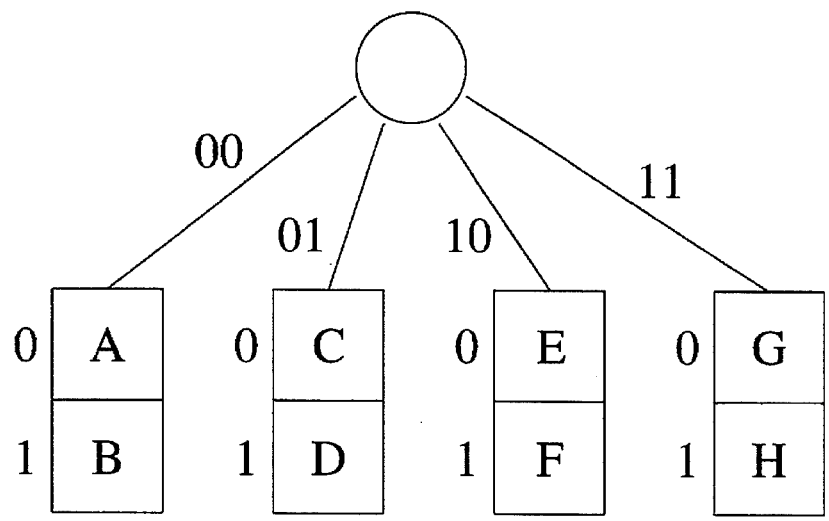
FIG. 2 shows a modified hybrid multiway radix search trie for the same search space of FIG. 1.

To better suit the present invention one minor modification to the usual hybrid multiway radix search trie is made by combining the lowest level of sub-nodes into sub-arrays of equal size. In the trie in FIG. 2, the first 2 bits of a key determine which sub-array to use, while the last bit serves as the sub-array index. Note that none of the features of the usual hybrid multiway radix search trie have been lost. For consistency, the 'modified hybrid multiway radix search tries' will simply be referred to as a tries.

At first glance, one skilled in the art will understand that tries tend to be very large, especially if the number of layers is large. However, for storing and retrieving sparse or redundant data, a trie can be easily minimized with three simple minimizing operators.

Figure 3:
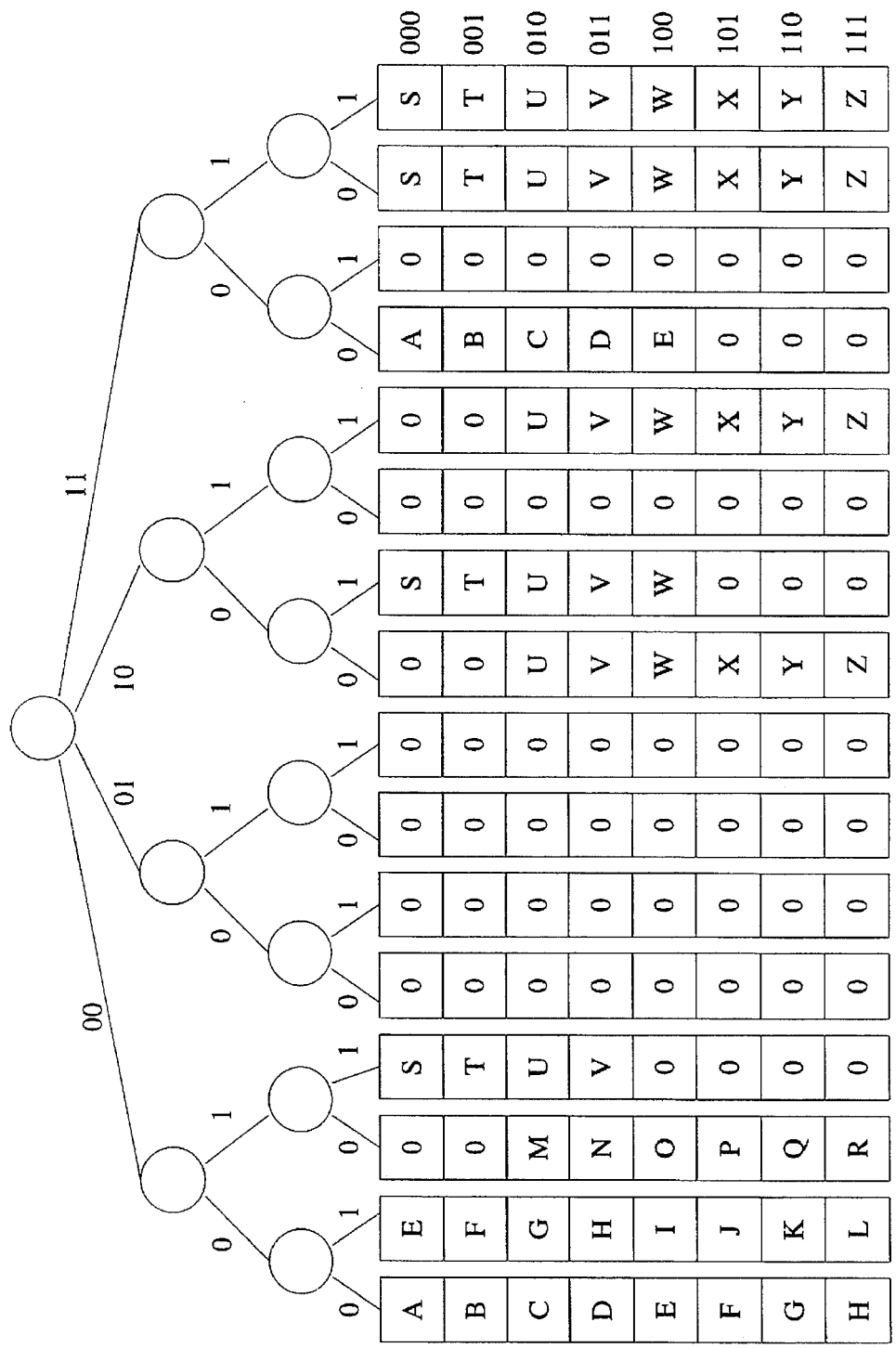
FIG. 3 is a modified hybrid multiway radix search trie of search space used for exemplary purposes.

First, consider the modified trie in FIG. 3. This trie maps the integers 0–128 to the alphabet A–Z, but contains sparse (unmapped integers map to Ø) and redundant data. Assuming that a pointer is 2 bytes long and a sub-array element is 1 byte long, this trie would require:

28 pointers*2 bytes+128 sub-array elements=184 bytes

This is indeed large when compared to the 128 bytes needed for the simple sub-array approach. However, the next sections present and analyze the trie minimizing operators.

The delete empty sub-array minimizing operator exploits regular gaps in the mapping. Breaking the mapping data into sub-arrays in such a way that many empty sub-arrays occur, results in great savings by deleting these sub-arrays. Applying this operator to the trie from FIG. 3 yields the trie in FIG. 4.

Using the same size assumptions as for FIG. 3, this trie would require:

28 pointers*2 bytes+80 sub-array elements=136 bytes

Next, after deleting all of the empty sub-arrays, even more savings can be had by deleting interior sub-nodes whose pointers are all Ø. Applying this operator to the trie from FIG. 4 yields the trie in FIG. 5. Again using the same size assumptions, this trie requires:

22 pointers*2 bytes+80 sub-array elements=124 bytes

Finally, the tail portion of one sub-array is compared to the head portion of another. If they match, the two sub-arrays are overlapped, adjusting any pointers as necessary. FIG. 6 shows the results of applying overlapping to the trie in FIG. 5.

Overlapping can be classified as two types. Type I overlapping is characterized by the overlapping of arbitrary sub-arrays, without special knowledge of the data being compared. An extreme case would be when one non-empty sub-array turns out to be an exact copy of another. The first and last pairs of sub-arrays in FIG. 5 exemplify Type I overlapping. Performing Type I overlapping is extremely computationally expensive. A non-optimal algorithm for performing Type I overlapping is described below:

1) Label each sub-array in the file A=$a_1, a_2, \ldots a_n$ where n is the total number of sub-arrays;

2) Pick a sub-array $a_i$;

3) For $a_i$, find the best overlapping sub-array $a_j$, $1 \leq j \leq n$, $i \neq j$ and $a_j$ not already marked as overlapped;

4) Increase total savings by the amount of overlap between $a_i$ and $a_j$;

5) If the saving is >0, mark $a_j$ as overlapped;

6) Increase i; and

7) Repeat steps 3 through 6 for all $a_i$.

Note, this algorithm is not guaranteed to give the optimal savings from Type I overlap, but it is simple to implement and has a quicker execution time than the optimal solution. Computation is still extensive with this algorithm. Assuming each sub-array is of length l, the Type I overlapping requires $O(n^2 l^2)$ comparisons in the worst case. Substituting (FileSize/n) for l yields $O(FileSize^2)$.

Type II overlapping is characterized by the fact that all matching sub-array positions contain exactly the same value. In most cases, this value will be Ø. An example of a Type II overlapping exists in the 3rd and 4th sub-arrays in FIG. 5. The method for optimal savings for this type of overlapping is as follows:

1) Determine the number of overlappable elements at the tail of each sub-array;

2) Determine the number of overlappable elements at the head of each sub-array;

3) Sort the tail information from step 1 in descending order;

4) Sort the head information from step 2 in descending order; and

5) Match the heads and tails accordingly, making sure not to overlap a sub-array with itself.

Using the same size assumptions, this trie requires:

22 pointers*2 bytes+62 sub-array elements=106 bytes

Note that this is a 22 byte savings over the lookup table method. This is a 17% savings! In addition, the trie has a search time of approximately ½ that of a worst case binary search over the same space.

This contrived example was presented to introduce the trie minimizing operators. Good results were obtained by breaking the search space into sub-arrays of length 8 and using 3 levels of nodes. But there are many other ways to define a trie over that search space. What about breaking the search space into sub-arrays of length 64 with 1 level of nodes? Such a trie, even after applying the trie minimizing operators, would require:

2 pointers*2 bytes+126 sub-array elements=130 bytes

In other words, over the same search space, the amount of savings exacted from a minimized trie depends on three factors:

1) The size of the sub-arrays;
2) The number of layers; and
3) The type of sub-node at each layer.

If the search space is large enough or if the data requires Type I overlapping, the optimal trie may be too difficult to find by empirical study or brute force methods. This is the kind of problem where genetic algorithms are most effective. The Shift-Jis to Unicode mapping problem has a search space of 65,565 points, which makes it a good candidate for minimization using the present invention.

What is needed is a binary representation for all possible tries that can be used to store the Shift-Jis to Unicode mapping. Given a search key of length l bits, note that there are (l–1) positions to partition the keys, thereby determining the size of the sub-arrays, the number of layers of nodes, and the types of nodes in each layer.

Figures 7, 8:
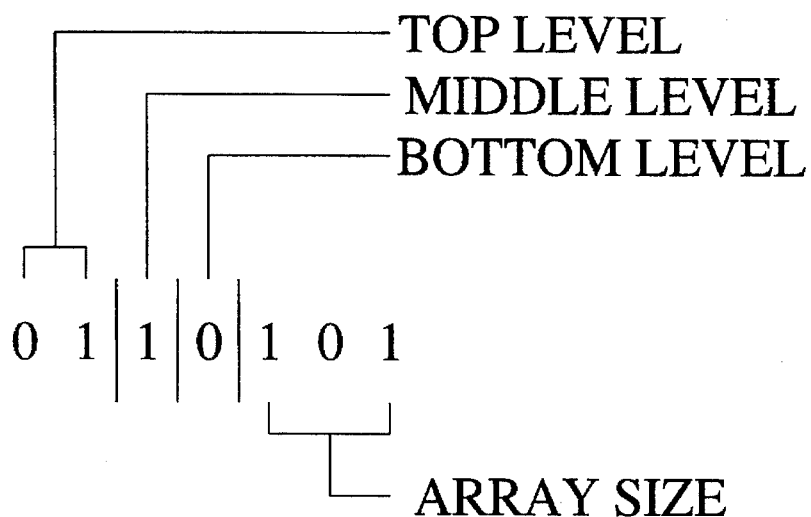
FIG. 7 provides one possible search key and partitions used to represent a modified hybrid multiway radix search trie.
FIG. 8 provides one possible binary encoding used to represent a modified hybrid multiway radix search trie.

Consider the trie in FIG. 3 and the search key of FIG. 7. For that search space, l=7. First, number the bits of the search key from left to right, starting with 1. For a sub-array of size 8, the last three bits function as the index. In other words, partitioning the keys between bit positions 4 and 5 creates the desired sub-array. Next, a layer of 8 sub-nodes with 2 pointers per node is created by partitioning the keys between bit positions 3 and 4. In the next layer, 4 sub-nodes with 2 pointers per node is created by partitioning the keys between bit positions 2 and 3. Finally, the top layer of 1 root node with 4 pointers uses both of the remaining bits.

It's easy to see that given a search key of length l bits, there exist exactly $2^{(l-1)}$ different tries that can store the search space. Therefore, it is possible to encode any of these tries as an (l–1) bit binary string, where a 1 at bit position n in the encoding indicates that the keys will be partitioned between bit positions n and (n+1). FIG. 8 shows the partitioned key and trie encoding for the same example used in FIG. 7.

Because Shift-Jis codes are used as the search keys, and Shift-Jis codes can all be represented in 2 bytes, the keys are 16 bits long. Therefore, the trie encoding for the genetic algorithm is 15 bits long, consisting of 15, 1-bit fields. A 1 in field n in the genetic algorithm encoding indicates that the keys will be partitioned between bit positions n and (n+1). Note that there are no special constraints on any of the fields.

Figure 11:
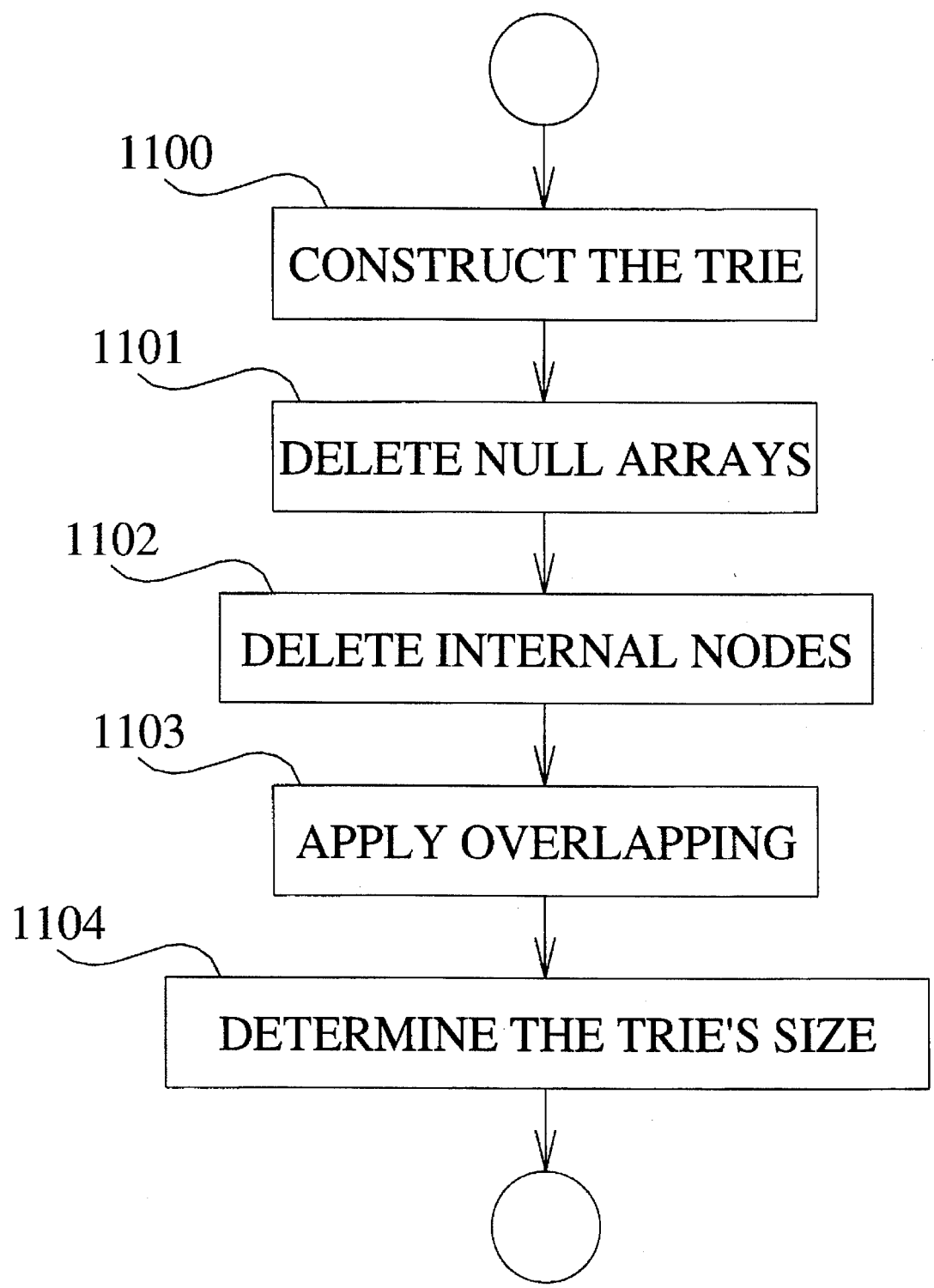
FIG. 11 is a flow chart showing the step used to evaluate the fitness of the individual members of the population.

There exists no mathematical formula on which to base a fitness function. Instead, the fitness function is constructive as shown in FIG. 11. Given a trie encoding:

1) Construct the trie (1100);
2) Apply null sub-array deletion (1101);
3) Apply sub-node deletion (1102);
4) Apply overlapping (1103); and
5) Calculate the trie's size in bytes, assuming a pointer is 4 bytes long and a sub-array element (Unicode code) is 2 bytes long (1104)

Note that no penalty functions were required.

For this application, tournament selection was employed with a tournament size of 2. Single point crossover was used, with a probability of crossover, $P_c$=0.9. Mutation was also used with a probability of mutation, $P_m$=1/(population size) for all trials. All trials ran for 100 generations. Each trial was started with a different random number seed.

Figure 9:
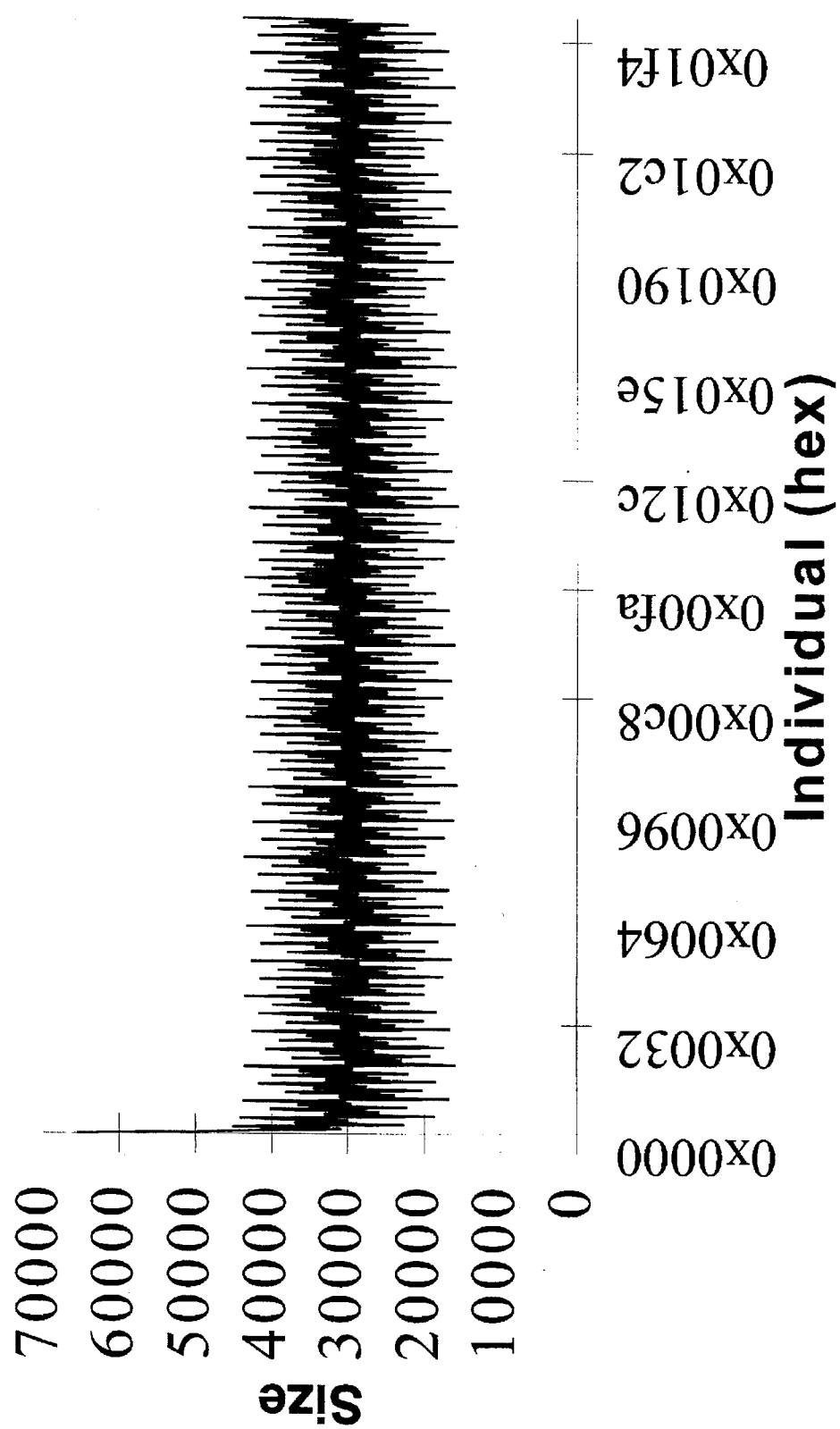
FIG. 9 shows partial results of brute force calculations to find the optimum trie for a Shift-Jis to Unicode mapping.

One observation about this problem must be made: the Shift-Jis to Unicode mapping does not contain Type I overlappable data. This being the case, Type I overlapping was removed from the implementation to speed up the objective function. Another positive side effect of this was that a brute-force method of finding the global optimum was possible. It took several hours on an HP700 workstation to complete, but it provides a picture of what the search space looks like and a true value for the global optimum, 15,684 bytes. FIG. 9 shows partial results of the brute force calculations.

Figure 10:
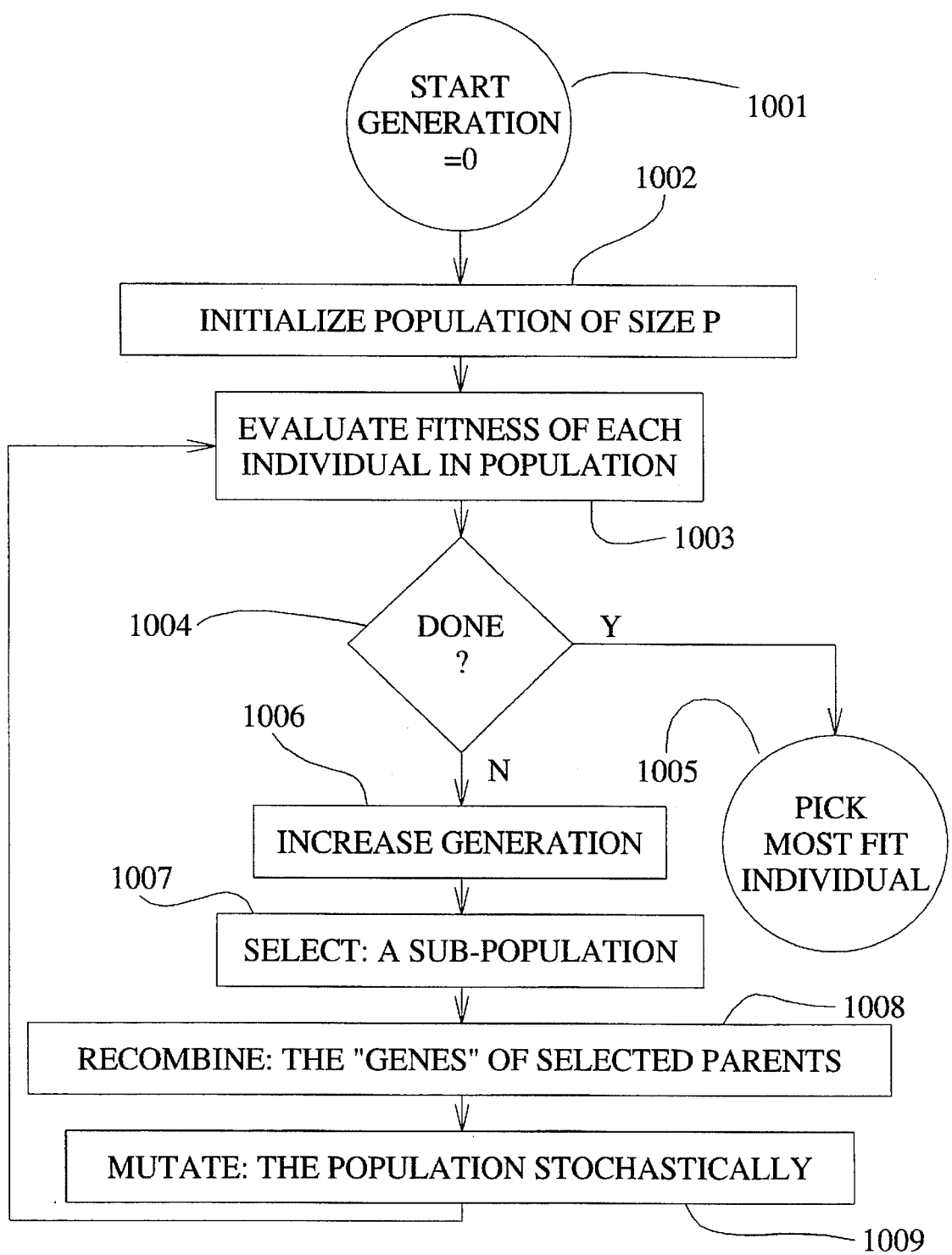
FIG. 10 is a high level flow chart showing the steps necessary to implement a genetic algorithm in accordance with the present invention.

Referring now to FIG. 10 where a simplified flow chart of a general genetic algorithm used in the preferred embodiment is shown. Prior to starting a genetic algorithm, an initial population size (P) and number of generations must be selected. In general, as the population size (P) increases, the convergence of the genetic algorithm occurs with fewer generations. However, the increased population size has an adverse effect on the single generation execution time of the genetic algorithm.

Given a population size of P, the genetic algorithm first initializes the population to a generally random sampling 1002. Next, in 1003, the fitness of each individual in the population (P) is evaluated. If the number of generations executed equals the maximum number of generations as originally selected, then in 1005 the most fit individual is selected. In the alternative, the next generation is created 1006. In creating the next generation, a sub-population is first selected 1007, which then undergoes the genetic alterations as previously described. The selection processes used in the preferred embodiment copies individuals from previous generation giving the most fit individuals the most copies and the least fit individuals the fewest or no copies. Genes of selected parents are recombined 1008 by picking mating pairs and recombining their genes to form children through a simple crossover operation. Portions of the population are stochastically mutated 1009 with a low probability, which randomly mutates alleles in the children. The new population is now evaluated for fitness of each individual 1003 and the iterative process of the genetic algorithm continues. Each new generation goes through the selection, recombination, and mutation processes until the desired number of generations have been evaluated. After the last generation, the most fit individual is selected 1005.

The fitness evaluation function of 1003 in FIG. 10 is shown in greater detail in FIG. 11. First the trie is constructed 1100. Next, any empty sub-arrays 1101 or null sub-nodes 1102 are deleted. Next, any overlapping is removed 1103. Finally, 1104 determines the trie's size. It is the overall size of the trie that is the determining characteristic in the fitness for any individual member of the population. It is the desired goal to find the absolute minimum size that accomplishes the desired mapping.

Five trials of increasing population size were tried. The first trial, with a population size of 5, resulted in a solution with a size of 15,740 bytes. The trial with a population size of 10 found a solution with a size of 15,708 bytes. The trial with population size of 20 found the optimal solution, with encoding 000000100100000 and a size of 15,684 bytes, in 47 generations. The trial with population size of 50 found the optimal solution in just 8 generations. The trial with population size of 100 found the optimal solution in 13 generations.

Figures 12, 13:
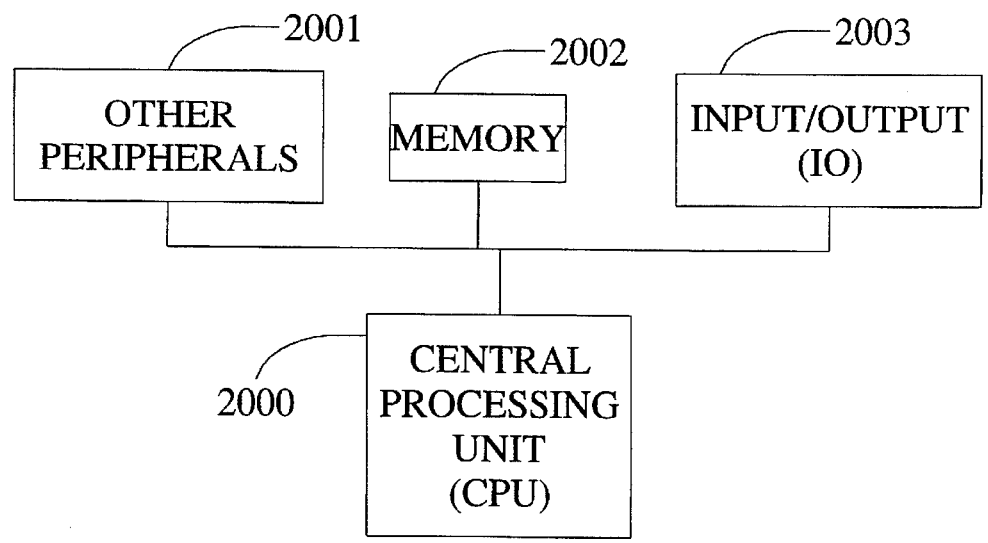
FIG. 12 provides a comparison of the relative compression ratios for various data type using the present invention and popular compression technique.
FIG. 13 illustrates a high level block diagram of a general purpose computer system used in accordance with the present invention

The optimal solution constitutes a 95% reduction in the space required for a simple array and a 44% reduction in the space required by a lookup table The present invention was applied to other forms of data as shown in FIG. 12. One must make an observation about the examples used, namely that there is no known optimal solution for any of the six cases presented here. Also, none of these files contained much blank space and therefore it was necessary to implement Type I Overlapping to get useful results.

The present invention successfully reduced the memory requirement for several types of image data. Using the preferred embodiment, which is a trie structure, compression ratios of 20%–60% were achieved on all but one of the six file types.

As stated earlier, the trie structure provides faster and more memory efficient access than other known compression schemes. Two points should be emphasized. First, the present invention allows for quick, random access of the original data from the trie. Second, because the data can be accessed randomly, there is no need to decompress a file back to its original format prior to accessing the original data. Therefore, the actual memory savings may be higher with the present invention because no memory is needed to store the uncompressed data.

Because the present invention works well on image data of many types and yields a compressed file that can be randomly accessed without decompression, it works well for archiving image file databases. One would need only save the encoded trie for each file. Then, by simply accessing the trie, the image is quickly displayed. The present invention may even be used to compress the frames of a feature film.

By exploiting redundant data, the present invention is well suited for compressing relational databases because many tuples will contain the same entry for any one particular field. For example, a telephone database would have the same area code repeated several thousand times.

The present invention, while not successful on all file types, is useful for compressing many types of computer data. Thus, one skilled in the art will understand that the present invention is a useful general compression scheme well suited for applications needing quick, random access to the original data.

Although the preferred embodiment of the invention has been illustrated, and that form described, it is readily apparent to those skilled in the art that various modifications may be made therein without departing from the spirit of the invention or from the scope of the appended claims.

Figure 4:
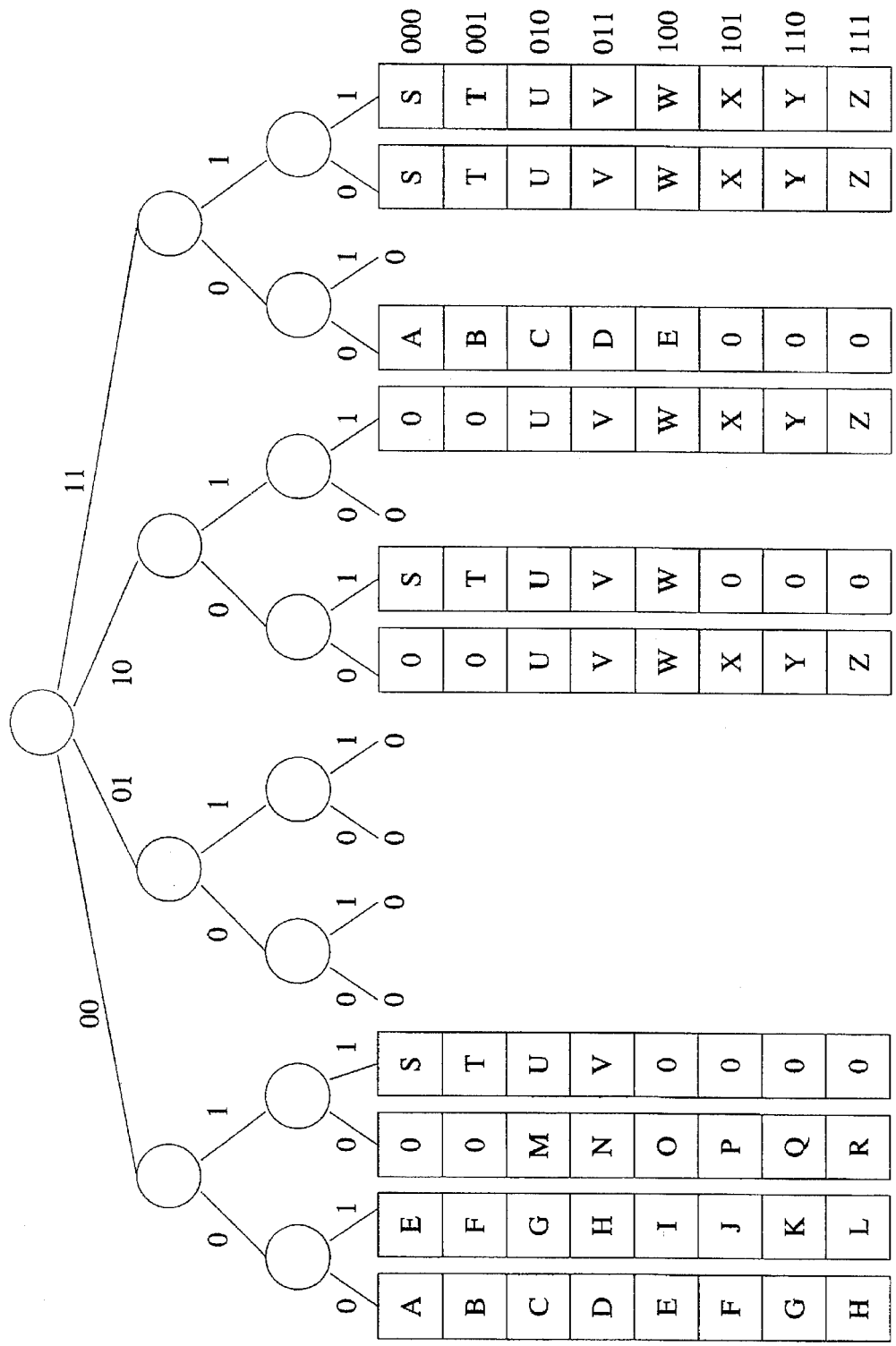
FIG. 4 shows the modified hybrid multiway radix search trie of FIG. 3 after all empty sub-arrays are deleted.
Figure 5:
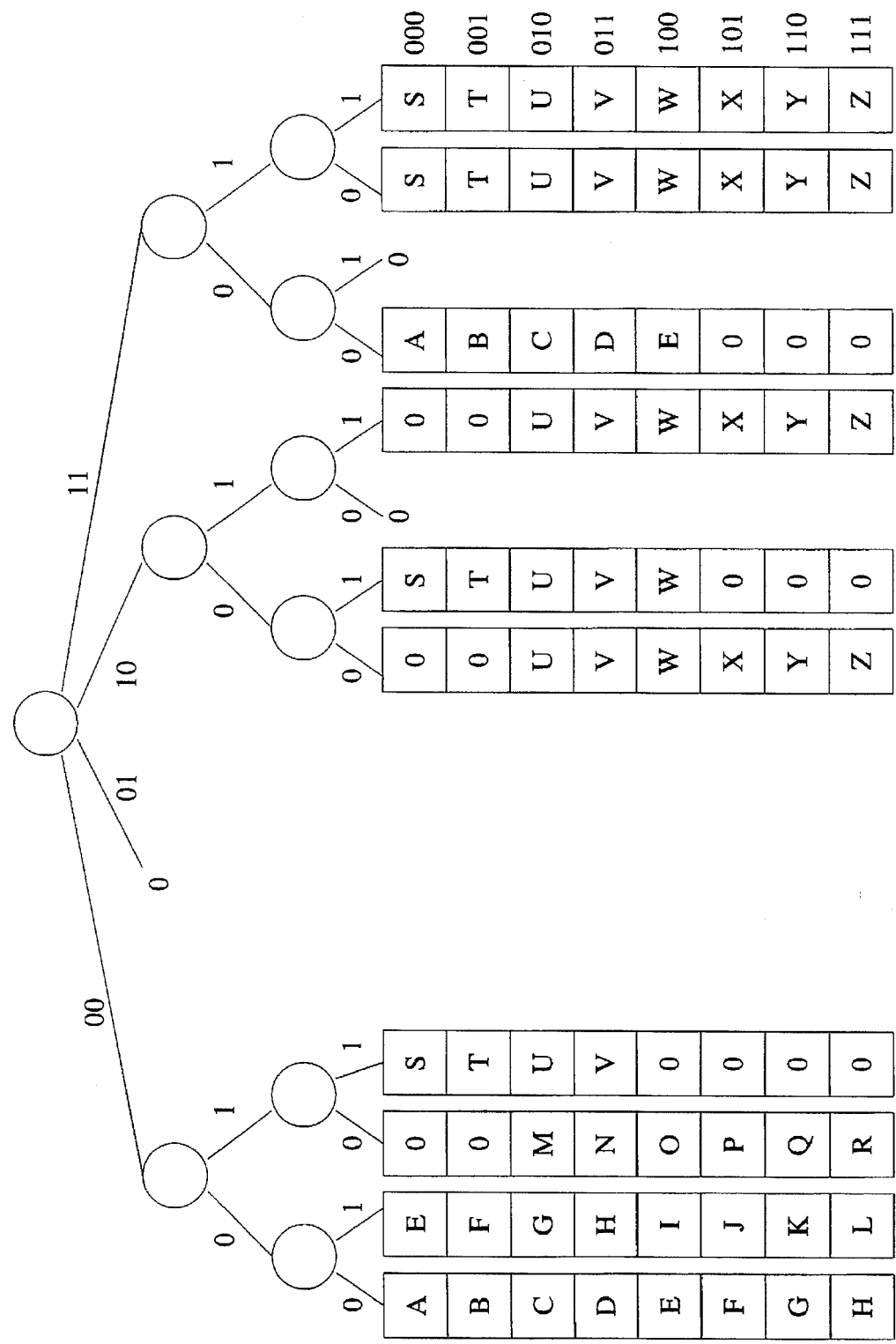
FIG. 5 shows the modified hybrid multiway radix search trie of FIG. 4 after empty sub-nodes are deleted.
Figure 6:
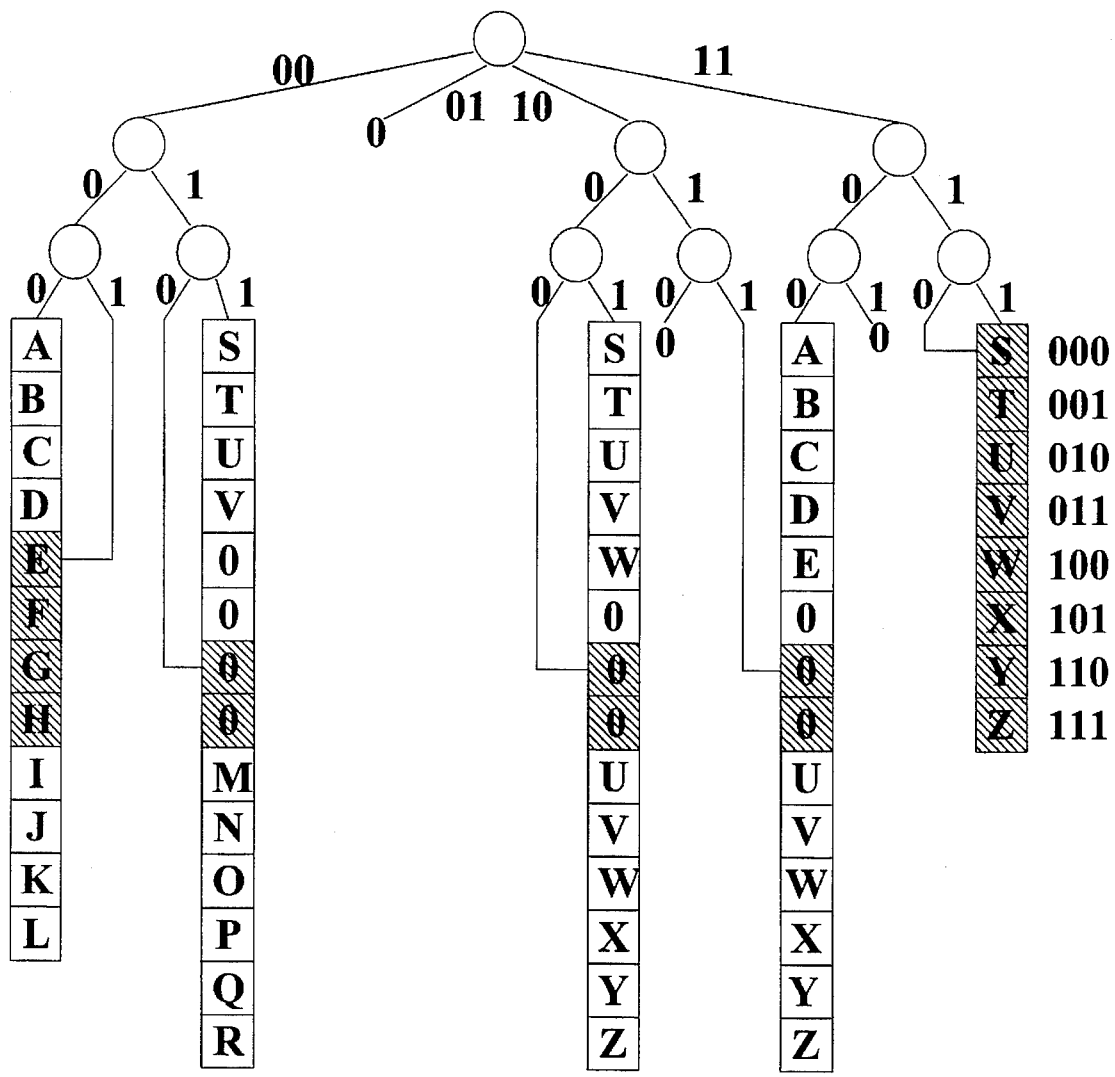
FIG. 6 shows the results of applying overlapping to the modified hybrid multiway radix search trie of FIG. 5.

One such modification relates to the empty sub-array and sub-node deletion as shown in FIGS. 4 and 5. While the preferred embodiment deleted empty sub-arrays, a simple modification allows for the deletion of sub-arrays containing redundant copies of a predefined character. To make this procedure adaptive, the data is first scanned and the character with the highest occurrence count is designated as the predefined character. Thereafter, sub-arrays that contained only the predefined character are deleted. The identity of the deleted character is stored only once for the entire trie.

The empty sub-array deletion step may be made more general than that just described by allowing for the deletion of any sub-array filled with any one character. For example, if one sub-array held only "R"s it is deleted. Some additional structure must be added to the sub-node to indicate that the deleted sub-array contained all "R"s Within the same trie another sub-array containing all "P"s is deleted and the sub-node adjusted. Memory savings of the sub-array deletion are offset by the added complexity of the sub-nodes and depends on the nature of the data.

What is claimed is:

1. A method for storing original data in a computer memory, said method comprising the steps of:
   picking a number of generations;
   initializing a plurality of individuals;
   for each individual, determining a size for a trie symbolized by said each individual where said trie represents said original data;
   selecting a mating population from said plurality of individuals where probability of selection for an individual is inversely proportionate to said individual's trie size;
   choosing and performing at least one operation for said mating population, where said operation is the operation of crossover;
   said operation of crossover comprising creating at least one new individual by crossover using at least two individuals from said mating population, adding said new individual to said plurality of individuals;
   iteratively doing said steps of determining, selecting, and choosing and performing for said number of generations times; and
   keeping in memory the trie having minimum said size.

2. The method as described in claim 1 wherein said step of selecting comprising:
   defining said mating population as having a plurality of individuals, said number of individuals in said mating population equals the number of individuals in said plurality of individuals;
   copying individuals from said plurality of individuals to said mating population where probability of being copied is inversely related to said individual's trie size; and
   deleting all individuals in said plurality of individuals.

3. The method as described in claim 1 wherein said individual is a binary number with N number of bits set to a first value, said step of crossover occurs by exchanging first value bits between said at least two individuals.

4. The method as described in claim 1 wherein said step of initializing randomly generates said plurality of individuals.

5. The method as described in claim 2 wherein said step of choosing and performing further comprising an operation of mutation, if said chosen operation is mutation, mutating said individual by stochastically changing a property of said individual, placing said mutated individual in said plurality of individuals.

6. The method as described in claim 5 wherein said individual is a binary number with N number of bits set to a first value, said step of changing a property modifies said binary number.

7. The method as described in claim 1 wherein said step of determining comprising the steps of:
   creating a root node, a plurality of sub-nodes, and a plurality of sub-arrays in a hierarchical arrangement, said individual indicates a number of said sub-nodes and said sub-arrays, and a number of entries in said sub-array;
   deleting any of said plurality of sub-arrays which contain redundant data;
   removing any of said plurality of sub-nodes which contain redundant data; and
   applying overlapping reduction function.

8. The method as described in claim 7 wherein each of sub-array having a head and a tail, said step of applying overlapping reduction function comprising the steps of:
   first finding overlappable entries in said tail for each of said entries in said sub-array;
   second finding overlappable entries in said head for each of said entries in said sub-array; and matching said overlappable entries in said tail with said overlappable entries in said head.

9. The method as described in claim 8 wherein said individual is a binary number with N number of bits set to a first value, said step of creating further comprising the step of linking said root with said plurality of sub-nodes and said sub-arrays to form a modified hybrid multiway radix search tree, said root and said plurality of sub-nodes arranged in N levels.

10. A method for storing original data in a minimum amount of computer memory, said method comprising the steps of:

picking a number of generations;
 initializing a plurality of individuals;
 for each individual:
  constructing a trie, where said trie represents said original data, said trie comprising a root node, a plurality of sub-nodes, and a plurality of sub-arrays in a hierarchical arrangement, said individual indicates a number of said sub-nodes and said sub-arrays, and a number of entries in said sub-array;
  deleting any of said plurality of sub-arrays which contain redundant data;
  removing any of said plurality of sub-nodes which contain redundant data;
  applying overlapping reduction function to said trie;
  determining a size for said trie;
  associating said size to said individual;
 selecting a mating population from said plurality of individuals where probability of selection for an individual is inversely proportionate to said individual's trie size;
 choosing and performing at least one operation for said mating population, where said operation is the operations of crossover or mutation;
 if said chosen operation is crossover, creating at least one new individual by crossover using at least two individuals from said mating population, adding said new individual to said plurality of individuals;
 if said chosen operation is mutation, mutating an individual in said mating population by stochastically changing a property of said individual, placing said mutated individual into said plurality of individuals;
 iteratively performing steps for said number of generations times; and
 keeping in said memory the trie having minimum said size.

11. The method as described in claim 10 wherein said step of selecting comprising:

defining said mating population as having a plurality of individuals, said number of individuals in said mating population equals the number of individuals in said plurality of individuals;
 copying individuals from said plurality of individuals to said mating population where probability of being copied is inversely related to said individual's trie size: and
 deleting all individuals in said plurality of individuals.

12. The method as described in claim 10 wherein each of sub-array having a head and a tail, said step of applying overlapping reduction function comprising the steps of:

first finding overlappable entries in said tail for each of said entries in said sub-array;
 second finding overlappable entries in said head for each of said entries in said sub-array; and
 matching said overlappable entries in said tail with said overlappable entries in said head.

13. The method as described in claim 10 wherein said individual is a binary number with N number of bits set to a first value, said step of crossover occurs by exchanging first value bits between said at least two individuals, said step of changing a property modifies said binary number, said step of constructing further comprising the step of linking said root with said plurality of sub-nodes and said sub-arrays to form a modified hybrid multiway radix search tree, said root and said plurality of sub-nodes arranged in N levels.

14. A computer system that stores an original data comprising:

a memory in which a plurality of individuals are stored;
 a processor coupled to said memory, said processor executes a sequence of instruction;
 means for determining a size of a trie symbolized by each individual where said trie represents said original data, said means for determining coupled to said processor;
 means for selecting a mating population from said plurality of individuals where probability of selection for an individual is inversely proportionate to said individual's trie size;
 means for choosing and performing an operation for said mating population, where said operation is the operation of crossover, said means for choosing and performing coupled to said processor;
 means for performing said operation of crossover comprising creating at least one new individual by crossover using at least two individuals from said mating population, adding said new individual to said plurality of individuals; and
 means for keeping in memory the trie having minimum said size, said means for keeping coupled to said processor.

15. The computer system of claim 14 wherein said means for selecting further comprising:

means for defining said mating population as having a plurality of individuals, said number of individuals in said mating population equals the number of individuals in said plurality of individuals;
 means for copying individuals from said plurality of individuals to said mating population where probability of being copied is inversely related to said individual's trie size; and
 means for deleting all individuals in said plurality of individuals.

16. The computer system of claim 14 wherein said means for choosing and performing an operation further comprising an operation of mutation, said computer system further comprising means for performing said operation of mutation comprising stochastically changing a property of said individual, placing said mutated individual back into said plurality of individuals.

17. The computer system of claim 16 wherein said individual is a binary number with N number of bits set to a first value, said changing a property modifies said binary number.

18. The computer system of claim 14, said trie comprising:

a root node having at least two pointers; and
 at least two sub-arrays linked to said root node through said at least two pointers in a hierarchical arrangement, said at least two sub-arrays each having a plurality of entries in which said original data is stored.

19. The computer system of claim 18, said trie further comprising:

a plurality of sub-nodes located between said root node and said sub-arrays, said root linked with said plurality of sub-nodes and said sub-arrays to form a modified hybrid multiway radix search tree.

20. The computer system of claim 19 wherein said means for determining a size further comprising:

means for deleting any of said plurality of sub-arrays which contain redundant data;

means for removing any of said plurality of sub-nodes which contain redundant data;

means for applying overlapping reduction function; and means for counting the amount of said memory necessary to store the trie.

* * * * *